(12) United States Patent
Osawa

(10) Patent No.: US 10,332,967 B2
(45) Date of Patent: Jun. 25, 2019

(54) SEMICONDUCTOR DEVICE AND METHOD FOR MANUFACTURING THE SAME

(71) Applicant: ROHM CO., LTD., Kyoto-shi, Kyoto (JP)

(72) Inventor: Yuto Osawa, Kyoto (JP)

(73) Assignee: ROHM CO., LTD., Kyoto (JP)

(*) Notice: Subject to any disclaimer, the term of this patent is extended or adjusted under 35 U.S.C. 154(b) by 0 days.

(21) Appl. No.: 16/228,052

(22) Filed: Dec. 20, 2018

(65) Prior Publication Data

US 2019/0123154 A1 Apr. 25, 2019

Related U.S. Application Data

(62) Division of application No. 15/478,861, filed on Apr. 4, 2017, now Pat. No. 10,192,962.

(30) Foreign Application Priority Data

Apr. 6, 2016 (JP) ................. 2016-076793

(51) Int. Cl.
*H01L 29/06* (2006.01)
*H01L 29/08* (2006.01)
(Continued)

(52) U.S. Cl.
CPC ........ *H01L 29/407* (2013.01); *H01L 29/0649* (2013.01); *H01L 29/086* (2013.01); *H01L 29/1033* (2013.01); *H01L 29/4236* (2013.01); *H01L 29/42368* (2013.01); *H01L 29/66666* (2013.01); *H01L 29/66734* (2013.01);
(Continued)

(58) Field of Classification Search
CPC ............... H01L 29/0696; H01L 29/407; H01L 29/4236; H01L 29/66727; H01L 29/66666; H01L 29/66734; H01L 29/7813; H01L 29/7827; H01L 29/086; H01L 29/1033; H01L 29/0649; H01L 29/42368
See application file for complete search history.

(56) References Cited

U.S. PATENT DOCUMENTS 6,168,996 B1 * 1/2001 Numazawa ....... H01L 21/28185
  438/270
7,821,064 B2 * 10/2010 Rueb ................. H01L 29/0619
  257/213

(Continued)

*Primary Examiner* — Jasmine J Clark
(74) *Attorney, Agent, or Firm* — Hamre, Schumann, Mueller & Larson, P.C.

(57) ABSTRACT

A semiconductor device including, a semiconductor layer including a plurality of first trenches formed therein and a second trench formed in a region between the first trenches, channel regions formed in regions between the first and second trenches in a surface layer portion of the semiconductor layer, field plate electrodes embedded at bottom portion sides of the respective first trenches, first gate electrodes embedded at opening portion sides of the respective first trenches so as to face the channel regions across first gate insulating films above the field plate electrodes, second insulating films interposed between the field plate electrodes and the first gate electrodes, an embedded insulating film embedded to an intermediate portion of the second trench, and a second gate electrode embedded in the second trench so as to face the channel regions across a second gate insulating film above the embedded insulating film.

6 Claims, 16 Drawing Sheets

(51) Int. Cl.
*H01L 29/10* (2006.01)
*H01L 29/40* (2006.01)
*H01L 29/66* (2006.01)
*H01L 29/78* (2006.01)
*H01L 29/423* (2006.01)

(52) U.S. Cl.
CPC ...... *H01L 29/7813* (2013.01); *H01L 29/7827* (2013.01); *H01L 29/0696* (2013.01)

(56) References Cited

U.S. PATENT DOCUMENTS

| | | |
|---|---|---|
| 9,685,544 B2 * | 6/2017 | Hikasa ................ H01L 29/4966 |
| 2009/0256197 A1 | 10/2009 | Nakazawa et al. |
| 2012/0280315 A1 | 11/2012 | Shirai et al. |
| 2014/0179094 A1 | 6/2014 | Kobayashi et al. |

* cited by examiner

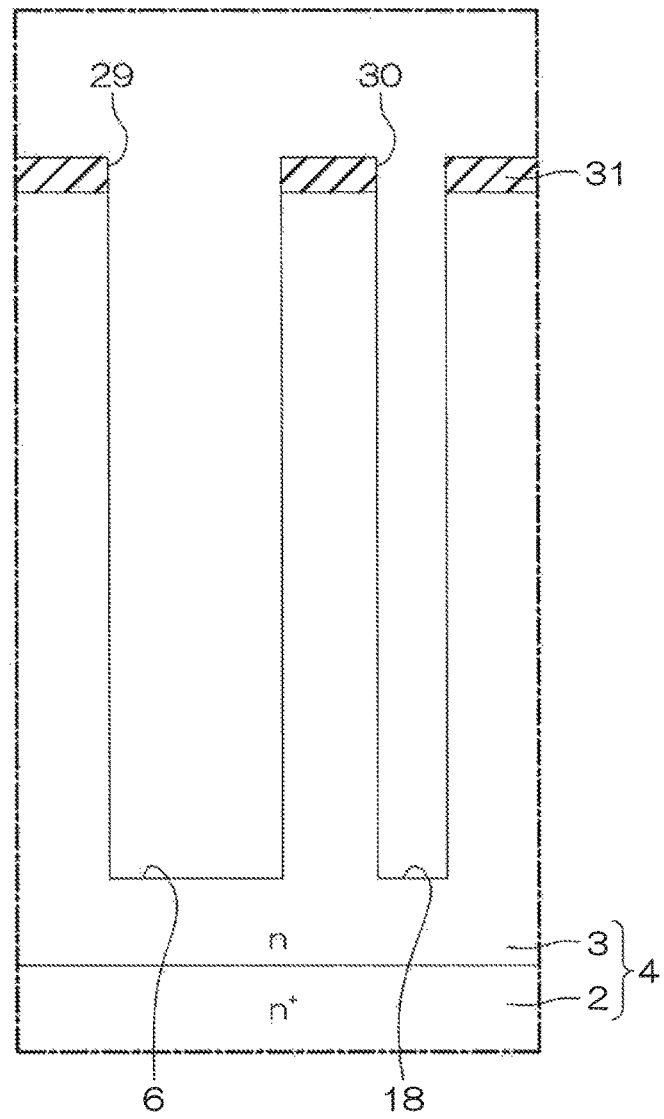

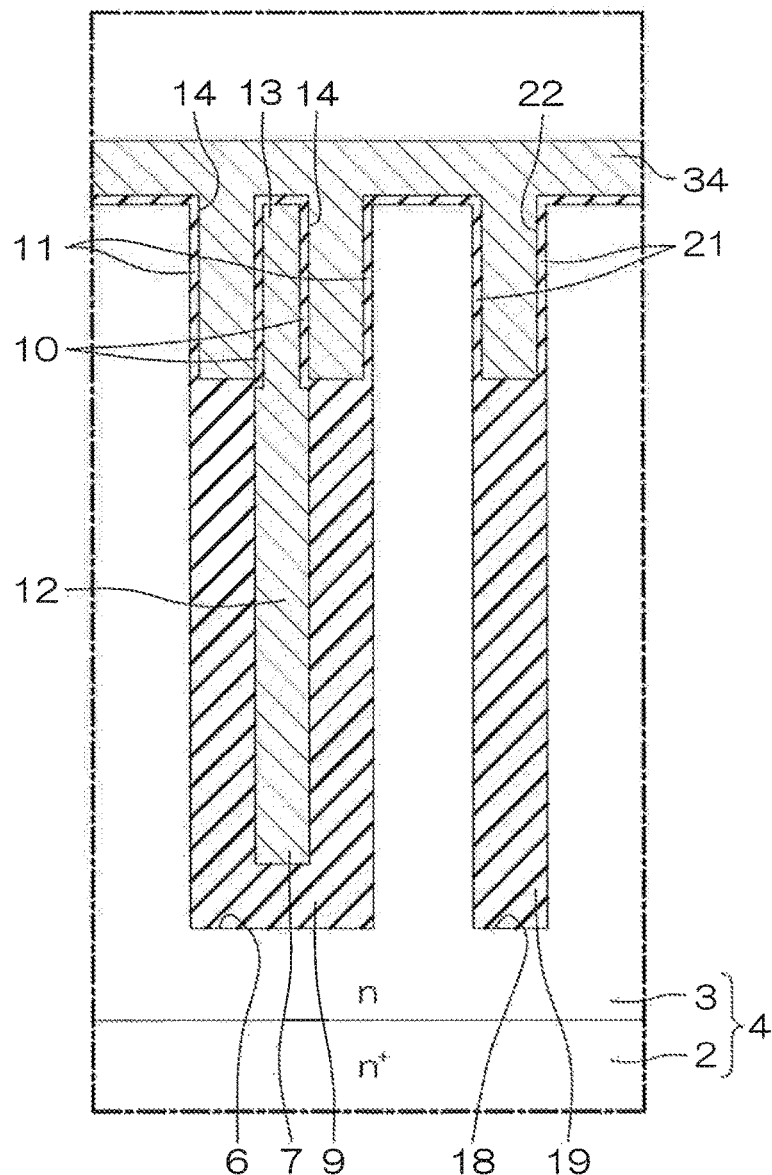

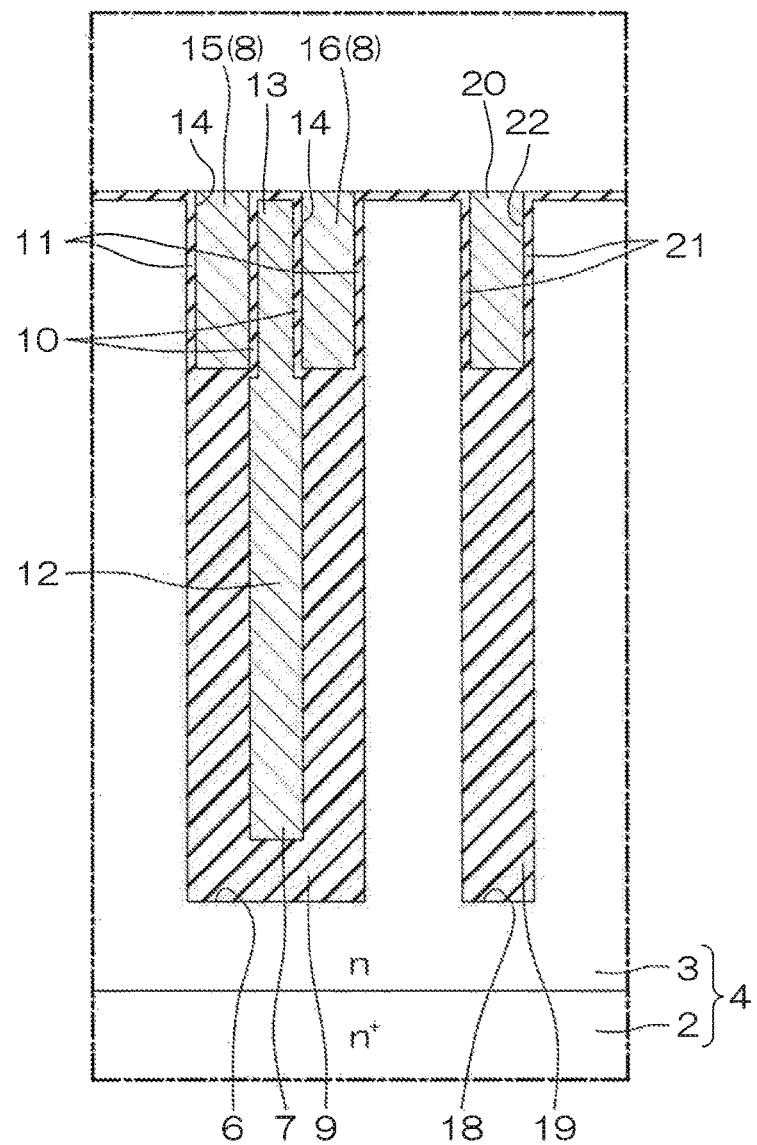

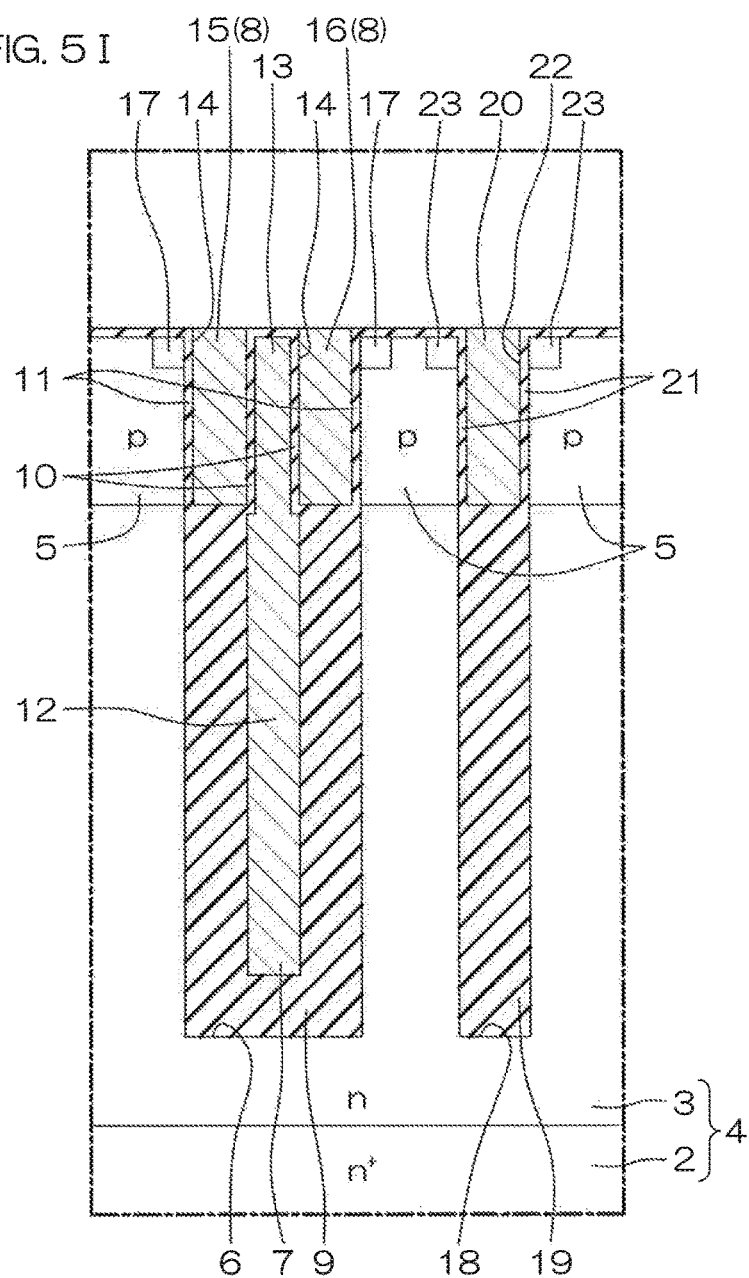

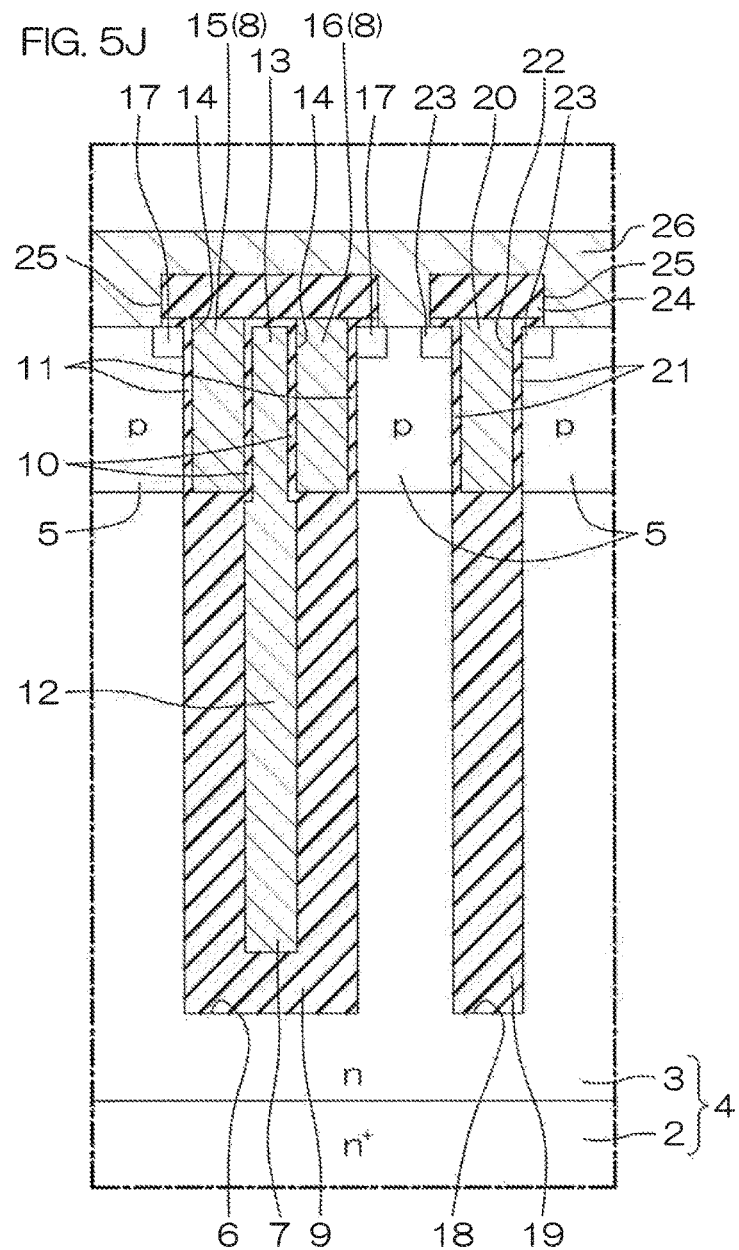

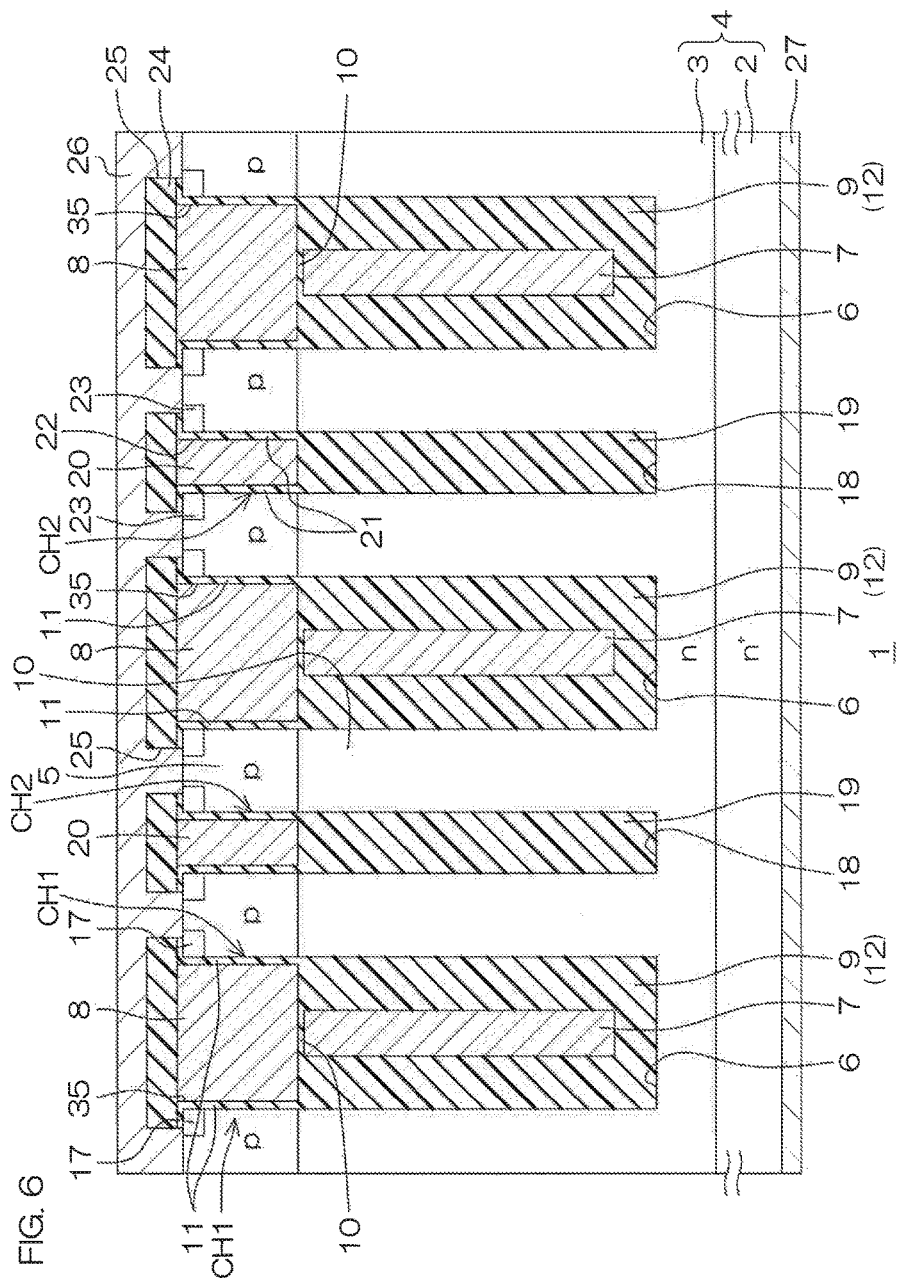

SEMICONDUCTOR DEVICE AND METHOD FOR MANUFACTURING THE SAME

BACKGROUND OF THE INVENTION

1. Field of the Invention

The present invention relates to a semiconductor device and a method for manufacturing the same.

2. Description of the Related Art

A semiconductor device is disclosed in US2014/179094A1. This semiconductor device includes a semiconductor layer having a plurality of trenches formed therein. At a bottom side of each trench, a field plate electrode is embedded with a first insulating film interposed therebetween. At an opening portion side of each trench, a gate electrode is embedded so as to face the semiconductor layer across a gate insulating film. The field plate electrode and the gate insulating film are insulated from each other by a second insulating film interposed therebetween.

SUMMARY OF THE INVENTION

A preferred embodiment of the present invention provides a semiconductor device, including a semiconductor layer, including a front surface having a plurality of first trenches formed therein and having a second trench formed therein in a region between mutually adjacent ones of the plurality of first trenches, channel regions, formed in regions between the first and second trenches in a surface layer portion of the semiconductor layer, field plate electrodes, embedded at bottom portion sides of the respective first trenches so as to face the semiconductor layer across first insulating films, first gate electrodes, embedded at opening portion sides of the respective first trenches so as to face the channel regions across first gate insulating films above the field plate electrodes, second insulating films, interposed between the respective field plate electrodes and the respective first gate electrodes, an embedded insulating film, embedded to an intermediate portion of the second trench in a depth direction of the second trench, and a second gate electrode, embedded in the second trench so as to face the channel regions across a second gate insulating film above the embedded insulating film.

A preferred embodiment of the present invention provides a method for manufacturing a semiconductor device, including the steps of, forming a plurality of first trenches in a front surface of a semiconductor layer, forming a second trench in the front surface of the semiconductor layer in a region between mutually adjacent ones of the plurality of first trenches, introducing an impurity into regions between the first and second trenches in a surface layer portion of the semiconductor layer to form channel regions, forming first insulating films along inner wall surfaces of the respective first trenches so as to define recessed spaces inside the respective first trenches, embedding an insulator in the second trench to form an embedded insulating film, embedding conductors in the recessed spaces defined in the respective first trenches to form field plate electrodes, removing the first insulating films to intermediate portions in a depth direction of the respective first trenches, removing the embedded insulating film to an intermediate portion in a depth direction of the second trench, forming first gate insulating films along portions of the inner wall surfaces of the respective first trenches that are exposed from the first insulating films, forming second insulating films along outer surfaces of the field plate electrodes that are exposed from the first insulating films inside the respective first trenches, forming a second gate insulating film along a portion of an inner wall surface of the second trench that is exposed from the embedded insulating film, embedding conductors in recessed spaces, defined by the first insulating films, the first gate insulating films, and the second insulating films, inside the respective first trenches to form first gate electrodes, and embedding a conductor in a recessed space, defined by the embedded insulating film and the second gate insulating film, in the second trench to form a second gate electrode.

The above and other objects, features, and effects of the present invention shall be made clear by the following description of preferred embodiments with reference to the attached drawings.

BRIEF DESCRIPTION OF THE DRAWINGS

FIG. 5A to FIG. 5J are sectional views of the method for manufacturing the semiconductor device of FIG. 1.

FIG. 6 is a sectional view of a first modification example of the semiconductor device of FIG. 1.

DETAILED DESCRIPTION OF THE PREFERRED EMBODIMENTS

Figure 1:
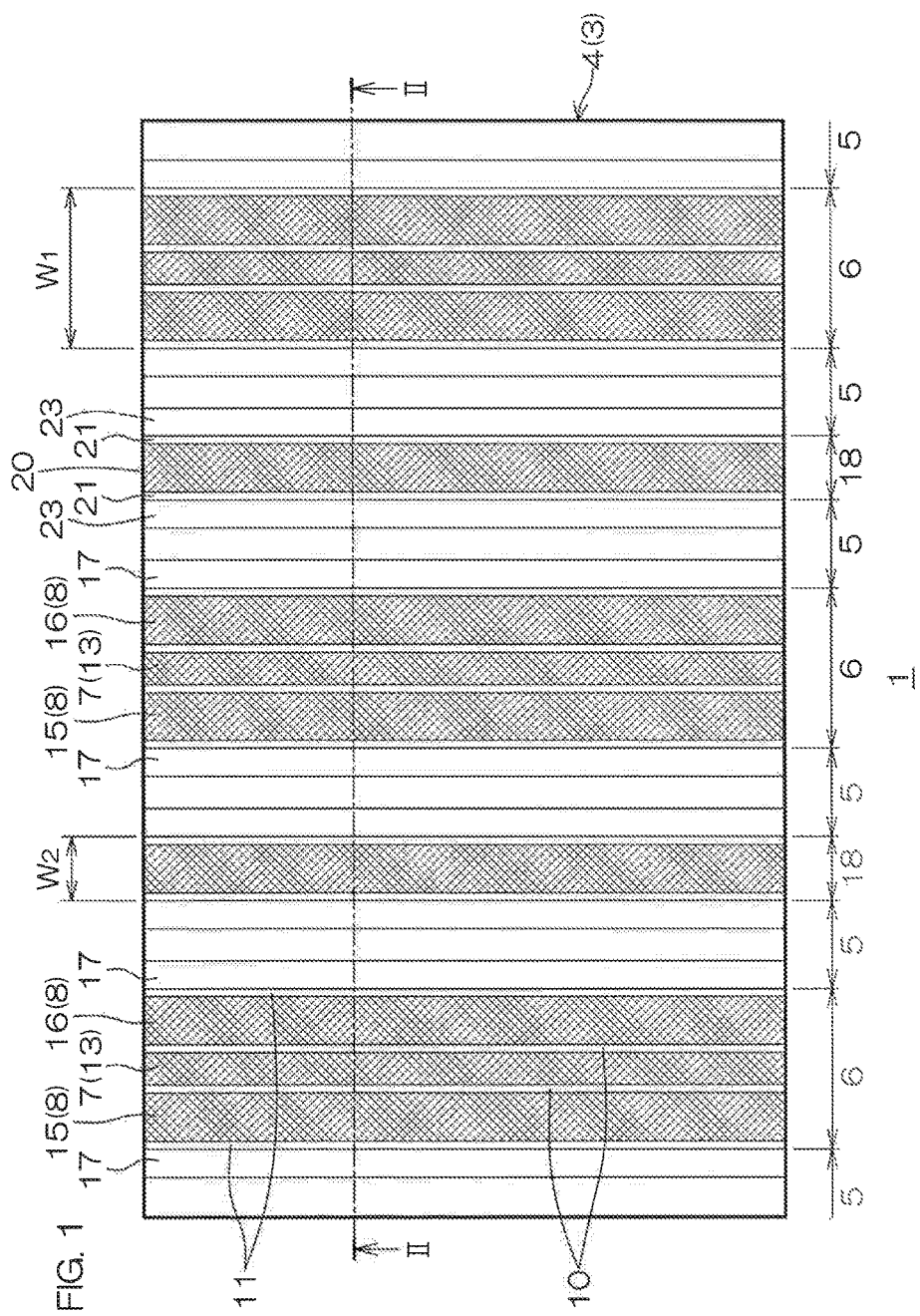
FIG. 1 is a plan view of a region of a portion of a semiconductor device according to a preferred embodiment of the present invention.

To achieve the reduction of an ON resistance in a semiconductor device having a structure such as that disclosed in US2014/179094A1, it may be considered to provide more trench structures in each of which a field plate electrode and a gate electrodes are embedded. An area of channels, which serve as current paths, per unit area increases by providing more trench structures and therefore the ON resistance decreases.

However, in this case, the number of field plate electrodes increases and therefore a capacitance value per unit area increases at the same time as providing more trench structures. Consequently, switching loss increases and energy consumption increases.

Therefore, in a preferred embodiment of the present invention, a semiconductor device having a structure where the increase of capacitance value can be suppressed while achieving the reduction of the ON resistance, and a method for manufacturing a semiconductor device having such a structure are provided.

A semiconductor device according to a preferred embodiment of the present invention includes a semiconductor layer, including a front surface having a plurality of first trenches formed therein and having a second trench formed therein in a region between mutually adjacent ones of the plurality of first trenches, channel regions, formed in regions between the first and second trenches in a surface layer portion of the semiconductor layer, field plate electrodes, embedded at bottom portion sides of the respective first trenches so as to face the semiconductor layer across first insulating films, first gate electrodes, embedded at opening portion sides of the respective first trenches so as to face the channel regions across first gate insulating films above the field plate electrodes, second insulating films, interposed between the respective field plate electrodes and the respective first gate electrodes, an embedded insulating film, embedded to an intermediate portion of the second trench in a depth direction of the second trench, and a second gate electrode, embedded in the second trench so as to face the channel regions across a second gate insulating film above the embedded insulating film.

According to the semiconductor device, the field plate electrodes and the first gate electrodes are embedded in the respective first trenches. In the respective first trenches, the first gate electrodes face the channel regions across the first gate insulating films. On the other hand, the second gate electrode and the embedded insulating film are embedded in the second trench. In the second trench, the second gate electrode faces the channel regions across the second gate insulating film.

Current paths are thus formed in the channel region formed at one lateral surface side of each first trench and the channel region formed at the other lateral surface side of each first trench. Also, current paths are formed in the channel region formed at one lateral surface side of the second trench and the channel region formed at the other lateral surface side of the second trench.

A proportion of an area of channels per unit area can thereby be increased. A semiconductor device, having a structure where the reduction of the ON resistance can be achieved, can thus be provided.

Also, according to the semiconductor device, not a field plate electrode but the embedded insulating film is embedded in the second trench formed in the region between the plurality of first trenches. A capacitance value between the embedded insulating film and the semiconductor layer is less than a capacitance value between the field plate electrode and the semiconductor layer.

The increase of capacitance value per unit area can thus be suppressed in comparison to a case where the same first trench is provided additionally in a region between mutually adjacent ones of the plurality of first trenches. A semiconductor device, having a structure where the increase of capacitance value can be suppressed, can thus be provided.

A method for manufacturing a semiconductor device according to a preferred embodiment of the present invention includes the steps of forming a plurality of first trenches in a front surface of a semiconductor layer, forming a second trench in the front surface of the semiconductor layer in a region between mutually adjacent ones of the plurality of first trenches, introducing an impurity into regions between the first and second trenches in a surface layer portion of the semiconductor layer to form channel regions, forming first insulating films along inner wall surfaces of the respective first trenches so as to define recessed spaces inside the respective first trenches, embedding an insulator in the second trench to form an embedded insulating film, embedding conductors in the recessed spaces defined in the respective first trenches to form field plate electrodes, removing the first insulating films to intermediate portions in a depth direction of the respective first trenches, removing the embedded insulating film to an intermediate portion in a depth direction of the second trench, forming first gate insulating films along portions of the inner wall surfaces of the respective first trenches that are exposed from the first insulating films, forming second insulating films along outer surfaces of the field plate electrodes that are exposed from the first insulating films inside the respective first trenches, forming a second gate insulating film along a portion of an inner wall surface of the second trench that is exposed from the embedded insulating film, embedding conductors in recessed spaces, defined by the first insulating films, the first gate insulating films, and the second insulating films, inside the respective first trenches to form first gate electrodes, and embedding a conductor in a recessed space, defined by the embedded insulating film and the second gate insulating film, in the second trench to form a second gate electrode.

According to the manufacturing method, the plurality of first trenches and the second trench are formed in the front surface of the semiconductor layer. The second trench is formed in the region between mutually adjacent ones of the plurality of first trenches. Each channel region is formed in the surface layer portion of the semiconductor layer in the region between first and second trenches that are mutually adjacent.

The field plate electrodes and the first gate electrodes are embedded in the respective first trenches. In the respective first trenches, the first gate electrodes face the channel regions across the first gate insulating films. On the other hand, the second gate electrode and the embedded insulating film are embedded in the second trench. In the second trench, the second gate electrode faces the channel regions across the second gate insulating film.

A current path is thus formed in each of the channel region formed at one lateral surface side of each first trench and the channel region formed at the other lateral surface side of each first trench. Also, a current path is formed in each of the channel region formed at one lateral surface side of the second trench and the channel region formed at the other lateral surface side of the second trench.

A proportion of an area of channels per unit area can thereby be increased. A semiconductor device, having a structure where the reduction of the ON resistance can be achieved, can thus be provided.

Also, according to the present manufacturing method, a semiconductor device, having a structure where the increase of capacitance value can be suppressed, can be manufactured and provided. That is, the embedded insulating film is embedded in the second trench formed in the region between the plurality of first trenches. A capacitance value between the embedded insulating film and the semiconductor layer is less than a capacitance value between the field plate electrode and the semiconductor layer.

The increase of capacitance value per unit area can thus be suppressed in comparison to a case where the same first trench is provided additionally in a region between mutually adjacent ones of the plurality of first trenches. A semiconductor device, having a structure where the increase of capacitance value can be suppressed, can thus be manufactured and provided.

A preferred embodiment of the present invention shall now be described in detail with reference to the attached drawings.

Figure 2:
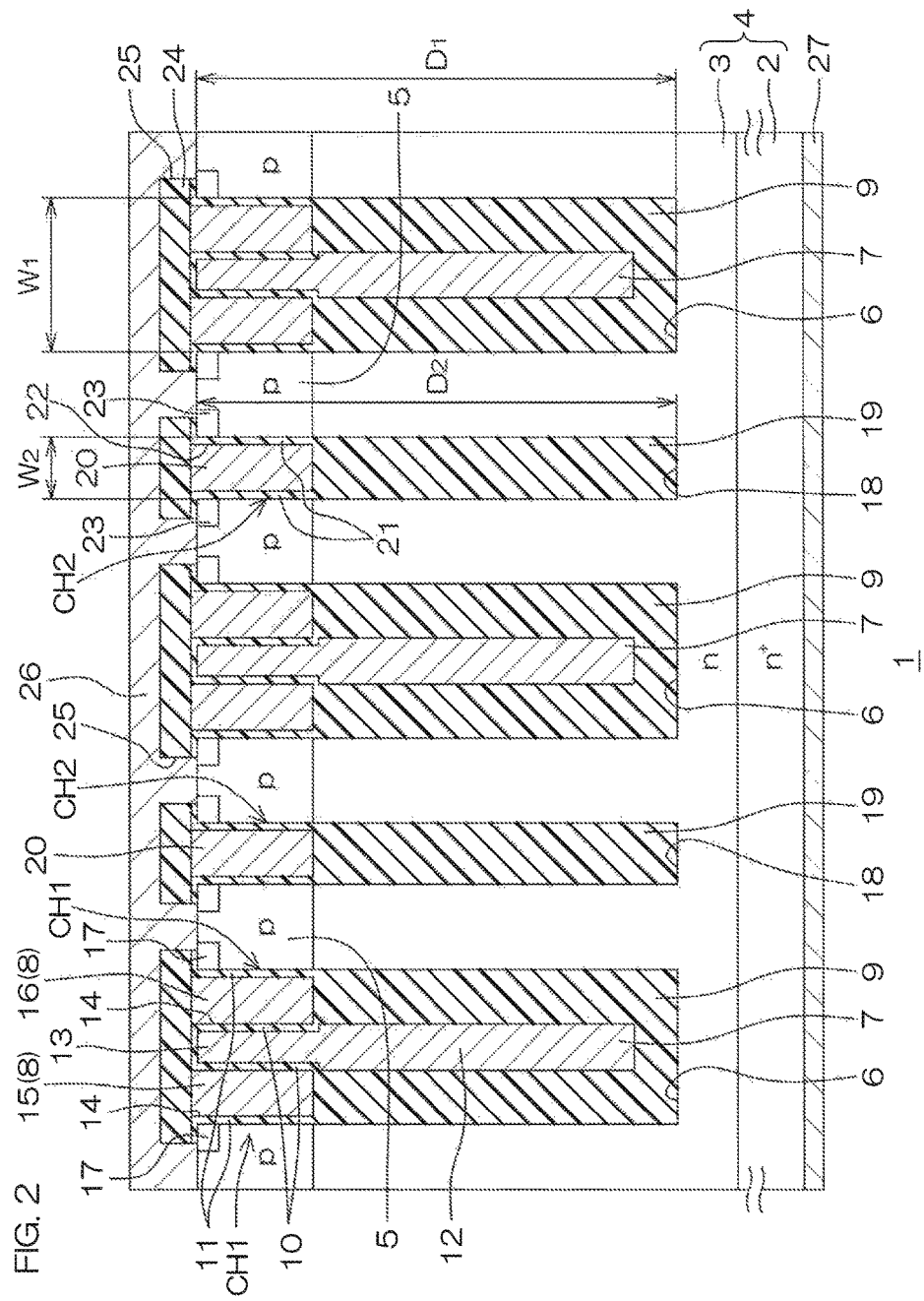
FIG. 2 is a sectional view taken along line II-II of FIG. 1.

FIG. 1 is a plan view of a region of a portion of a semiconductor device 1 according to the preferred embodiment of the present invention. FIG. 2 is a sectional view taken along line II-II of FIG. 1.

The semiconductor device 1 includes an intermediate withstand voltage type or high withstand voltage type MIS-FET (Metal Insulator Semiconductor Field Effect Transistor) having a source-drain voltage $V_{DSS}$ of equal to or greater than 100V and equal to or less than 500V.

Referring to FIG. 1 and FIG. 2, the semiconductor device 1 includes a semiconductor layer 4 having a front surface and a rear surface. The semiconductor layer 4 includes an n+ type semiconductor substrate 2 and an n type epitaxial layer 3 formed on the n+ type semiconductor substrate 2. The front surface of the semiconductor layer 4 is formed by the epitaxial layer 3. The rear surface of the semiconductor layer 4 is formed by the semiconductor substrate 2.

p type channel regions 5 are formed in a surface layer portion of the epitaxial layer 3. The p type channel regions 5 may be referred to as p type body regions or p type well regions.

A plurality of first trenches 6 is formed at intervals in the front surface of the semiconductor layer 4. In the present preferred embodiment, the plurality of first trenches 6 are formed in stripes extending in parallel in the same direction. In the following description, the direction in which the first trenches 6 extend shall be referred to as the first direction. Also, a direction intersecting (more specifically, orthogonal to) the first direction shall be referred to as the second direction.

Referring to FIG. 2, the plurality of first trenches 6 are formed so as to penetrate through the channel regions 5. Bottom portions of the plurality of first trenches 6 are positioned inside the epitaxial layer 3.

All of the plurality of first trenches 6 are high aspect ratio type trenches. More specifically, an aspect ratio $R_1$, defined as a ratio $D_1/W_1$ of a depth $D_1$ of each first trench 6 with respect to a width $W_1$ of the first trench 6, is equal to or greater than 1 (for example, equal to or greater than 3). The width $W_1$ of the first trench 6 is the width of the first trench 6 along the second direction.

A field plate electrode 7 and a first gate electrode 8 are embedded in each first trench 6. In FIG. 1, the field plate electrodes 7 and the first gate electrodes 8 are indicated by cross hatching.

At a bottom portion side of each first trench 6, the field plate electrode 7 is embedded with a first insulating film 9 interposed therebetween. The first insulating film 9 is formed along lateral surface of the first trench 6 to an intermediate portion in a depth direction of the first trench 6. The field plate electrode 7 faces the epitaxial layer 3 across the first insulating film 9. The field plate electrode 7 has a main body portion 12 and a projecting portion 13.

The main body portion 12 of the field plate electrode 7 faces the epitaxial layer 3 across the first insulating film 9. The projecting portion 13 of the field plate electrode 7 extends from the main body portion 12 toward an opening side of the first trench 6 and projects above an upper end portion of the first insulating film 9.

The projecting portion 13 of the field plate electrode 7 faces channel regions 5 in the second direction of the first trench 6. In regard to the second direction of the first trench 6, a width of the projecting portion 13 of the field plate electrode 7 is smaller than a width of the main body portion 12 of the field plate electrode 7.

The projecting portion 13 of the field plate electrode 7 is covered by a second insulating film 10. The second insulating film 10 covers an entirety of the projecting portion 13 of the field plate electrode 7. At an opening portion side of the first trench 6, two recessed spaces 14 are defined by inner wall surface of the first trench 6, the upper end portion of the first insulating film 9, the second insulating film 10, and first gate insulating films 11.

One space 14 of the two recessed spaces 14 is defined in a region between the projecting portion 13 of the field plate electrode 7 and one lateral surface of the first trench 6. The other space 14 of the two recessed spaces 14 is defined in a region between the projecting portion 13 of the field plate electrode 7 and the other lateral surface of the first trench 6.

A first gate electrode 8 is embedded with the first gate insulating film 11 interposed therebetween in each space formed at the opening portion side of the first trench 6 and above the field plate electrode 7. The first gate electrode 8 faces the channel regions 5 across the first gate insulating films 11. The field plate electrode 7 and the first gate electrode 8 are insulated by the second insulating film 10.

More specifically, the first gate electrode 8 is embedded in each of the two recessed spaces 14 formed at the opening portion side of the first trench 6. That is, the first gate electrode 8 is divided into a first portion 15 and a second portion 16 by the projecting portion 13 of the field plate electrode 7.

The first portion 15 of the first gate electrode 8 faces the channel region 5 formed at one lateral surface side of the first trench 6 across a first gate insulating film 11. The second portion 16 of the first gate electrode 8 faces the channel region 5 formed at the other lateral surface side of the first trench 6 across a first gate insulating film 11.

The first gate insulating films 11 are formed integral to the first insulating film 9. The second insulating film 10 is formed integral to the first insulating film 9. A thickness of the first insulating film 9 is greater than a thickness of each first gate insulating film 11 and a thickness of the second insulating film 10. The thickness of each first gate insulating film 11 and the thickness of the second insulating film 10 are substantially equal.

The field plate electrode 7 and the first gate electrode 8 include, for example, a polysilicon imparted with conductivity by addition of an impurity (for example, phosphorus). The first insulating film 9, the second insulating film 10, and the first gate insulating films 11 include, for example, silicon oxide.

n+ type first source regions 17 are formed in surface layer portions of the channel regions 5. In the surface layer portions of the channel regions 5, a first source region 17 is formed in a region along one lateral surface of each first trench 6 and in a region along the other lateral surface of each first trench 6.

The n+ type first source region 17, the p type channel region 5, and the n type epitaxial layer 3 are thus formed in this order from the opening side to the bottom portion side of the first trench 6 at one lateral surface side of each first trench 6. Also, the n+ type first source region 17, the p type channel region 5, and the n type epitaxial layer 3 are thus formed in this order from the opening side to the bottom portion side of the first trench 6 at the other lateral surface side of each first trench 6.

In each channel region 5, a region sandwiched by the first source region 17 and the epitaxial layer 3 is a first channel CH1, which serves as a current path. ON/OFF of the first channel CH1 is controlled by the corresponding first gate electrode 8.

Referring to FIG. 1, in the front surface of the semiconductor layer 4, a second trench 18 is formed in each region between two mutually adjacent first trenches 6. The first trenches 6 and the second trenches 18 are formed alternately along the second direction.

The second trenches 18 extend along the same direction (first direction) as the first trenches 6.

Referring to FIG. 2, the second trenches 18 are formed so as to penetrate through the channel regions 5. Each channel region 5 is thus shared by the first trench 6 and the second trench 18. Bottom portions of the second trenches 18 are positioned inside the epitaxial layer 3.

All of the second trenches 18 are high aspect ratio type trenches. A width $W_2$ of each second trench 18 is smaller than the width $W_1$ of each first trench 6. A ratio $W_2/W_1$ of the width $W_2$ of the second trench 18 with respect to the width $W_1$ of the first trench 6 is, for example, equal to or less than 0.5. The width $W_2$ of the second trench 18 is the width of the second trench 18 along the second direction. A depth $D_2$ of the second trench 18 is substantially equal to the depth $D_1$ of the first trench 6.

Therefore, an aspect ratio $R_2$, defined as a ratio $D_2/W_2$ of the depth $D_2$ of the second trench 18 with respect to the width $W_2$ of the second trench 18, is greater than the aspect ratio $R_1$ of the first trench 6. The second trench 18 has the depth $D_2$ that is substantially equal to the depth $D_1$ of the first trench 6.

An embedded insulating film 19 and a second gate electrode 20 are embedded in each second trench 18. In FIG. 1, the second gate electrodes 20 are indicated by cross hatching.

The embedded insulating film 19 is embedded in each second trench 18 so as to fill a region from a bottom portion to an intermediate portion in a depth direction of the second trench 18. The embedded insulating film 19 is in contact with the epitaxial layer 3. Therefore, when a portion, in which the embedded insulating film 19 is embedded in the second trench 18, is cut in a direction parallel to a front surface of the epitaxial layer 3, only the embedded insulating film 19 will be exposed from the cut surface.

In regard to a thickness direction of the semiconductor layer 4, an upper end portion of the embedded insulating film 19 is formed at a position of substantially equal depth as the upper end portion of the first insulating film 9. At an opening side of the second trench 18, a recessed space 22 is formed by the upper end portion of the embedded insulating film 19 and inner wall surface of the second trench 18.

In the recessed space 22 formed at the opening side of the second trench 18, the second gate electrode 20 is embedded with second gate insulating films 21 interposed therebetween. The second gate electrode 20 faces channel regions 5 across the second gate insulating films 21.

In regard to the thickness direction of the semiconductor layer 4, a thickness of the second gate electrode 20 is substantially equal to a thickness of the first gate electrode 8. In regard to the depth direction of the second trench 18, a proportion occupied by the insulating film 19 in the second trench 18 is greater than a proportion occupied by the second gate electrode 20 in the second trench 18.

The second gate electrode 20 includes, for example, a polysilicon imparted with conductivity by addition of an impurity (for example, phosphorus). The embedded insulating film 19 and the second gate insulating films 21 include, for example, silicon oxide. A thickness of each second gate insulating film 21 is substantially equal to the thickness of each first gate insulating film 11.

In addition to the first source regions 17, n+ type second source regions 23 are formed in the surface layer portions of the channel regions 5. In the surface layer portions of the channel regions 5, a second source region 23 is formed in a region along one lateral surface side of each second trench 18 and in a region along the other lateral surface side of each second trench 18.

The n+ type second source region 23, the p type channel region 5, and the n type epitaxial layer 3 are thus formed in this order from the opening side to the bottom portion side of the second trench 18 at one lateral surface side of each second trench 18. Also, the n+ type second source region 23, the p type channel region 5, and the n type epitaxial layer 3 are thus formed in this order from the opening side to the bottom portion side of the second trench 18 at the other lateral surface side of each second trench 18.

In each channel region 5, a region sandwiched by the second source region 23 and the epitaxial layer 3 is a second channel CH2, which serves as a current path. ON/OFF of the second channel CH2 is controlled by the corresponding second gate electrode 20.

In the present preferred embodiment, the second gate electrodes 20 are electrically connected to the first gate electrodes 8. The first gate electrodes 8 and the second gate electrodes 20 are thus equipotential. The first channels CH1 and the second channels CH2 in the channel regions 5 are controlled simultaneously by the first gate electrodes 8 and the second gate electrodes 20.

A front surface insulating film 24 is formed on the front surface of the semiconductor layer 4. The front surface insulating film 24 covers the first trenches 6 and the second trenches 18. Contact openings 25 are formed in the front surface insulating film 24. The contact openings 25 selectively expose the channel regions 5, the first source regions 17, and the second source regions 23.

A source electrode 26 is formed on the front surface insulating film 24. The source electrode 26 enters into the contact openings 25 from above the front surface insulating film 24. Inside the contact openings 25, the source electrode 26 is electrically connected to the channel regions 5, the first source regions 17, and the second source regions 23. A drain electrode 27 is connected to the rear surface of the semiconductor layer 4. The drain electrode 27 is electrically connected to the semiconductor layer 4.

Figure 3:
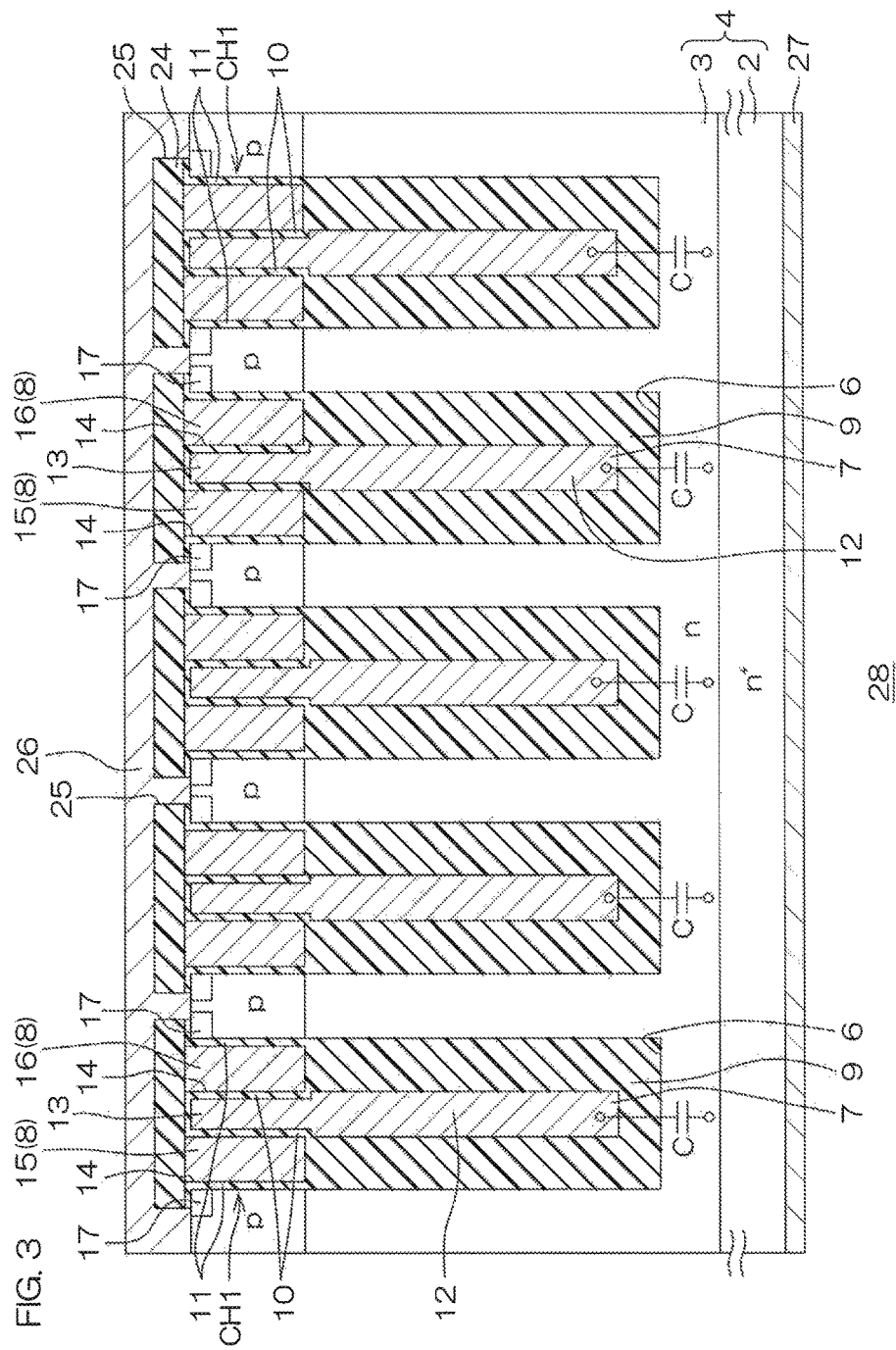
FIG. 3 is a sectional view for describing the structure of a semiconductor device according to a reference example.

FIG. 3 is a schematic sectional view of a semiconductor device 28 according to a reference example. FIG. 3 is also a sectional view of a portion corresponding to that of FIG. 2 described above. In FIG. 3, arrangements that are the same as the arrangements shown in FIG. 1 and FIG. 2 described above are provided with the same reference symbols and description thereof shall be omitted.

With reference to FIG. 3, the semiconductor device according to the reference example differs from the semiconductor device 1 according to the present preferred embodiment in that the second trenches 18 is not formed.

According to the semiconductor device 28 of the reference example, a distance (a pitch) between the plurality of first trenches 6 is made narrow. That is, according to the semiconductor device 28 of the reference example, a proportion of an area of first channels CH1 per unit area is made increased by increasing the number of first trenches 6 per unit area.

According to such a structure, the number of the field plate electrodes 7 also increases and therefore a parasitic capacitance C also increases. That is, the field plate electrodes 7 face the epitaxial layer 3 across the first insulating films 9. A parasitic capacitance C is thus formed between each field plate electrode 7 and the epitaxial layer 3.

Consequently, due to an increase in the number of field plate electrodes 7, a total value of the parasitic capacitances C formed between the field plate electrodes 7 and the epitaxial layer 3 increase. According to such a structure, although the reduction of the ON resistance can be achieved by the increase of the first channels CH1, a switching loss (consumption energy) is increased due to the increase of the total value of the parasitic capacitances C.

On the other hand, referring to FIG. 1 and FIG. 2, according to the semiconductor device 1 of the present preferred embodiment, the second trenches 18, which differ in structure from the first trenches 6, are formed in the regions between the plurality of first trenches 6. The field plate electrodes 7 and the first gate electrodes 8 are respectively embedded in the plurality of first trenches 6. The embedded insulating film 19 and the second gate electrode 20 are embedded in each second trench 18.

In each first trench 6, the first gate electrode 8 faces the channel region 5, formed at one lateral surface side of the first trench 6, across a first gate insulating film 11. Also in each first trench 6, the first gate electrode 8 faces the channel region 5, formed at the other lateral surface side of the first trench 6, across a first gate insulating film 11.

In each second trench 18, the second gate electrode 20 faces the channel region 5, formed at one lateral surface side of the second trench 18, across a second gate insulating film 21. Also in each second trench 18, the second gate electrode 20 faces the channel region 5, formed at the other lateral surface side of the second trench 18, across a second gate insulating film 21.

Therefore, a first channel CH1, which serves as a current path, is formed in each of the channel region 5 at the one lateral surface side of each first trench 6 and the channel region 5 at the other lateral surface side of each first trench 6. Also, a second channel CH2, which serves as a current path, is formed in each of the channel region 5 at the one lateral surface side of each second trench 18 and the channel region 5 at the other lateral surface side of each second trench 18.

A proportion of an area of the first channels CH1 and the second channels CH2 per unit area can thereby be increased. The semiconductor device 1, having a structure where the reduction of the ON resistance can be achieved, can thus be provided.

Also, according to the semiconductor device 1 of the present preferred embodiment, a capacitance value between each embedded insulating film 19 and the epitaxial layer 3 is small compared to the capacitance value (capacitance value C) between each field plate electrode 7 and the epitaxial layer 3. The increase of the capacitance value per unit area can thereby be suppressed in comparison to the structure of the semiconductor device 28 of the reference example.

In particular, according to the semiconductor device 1 of the present preferred embodiment, in regard to the depth direction of the second trench 18, the proportion occupied by the insulating film 19 in the second trench 18 is greater than the proportion occupied by the second trench 18.

Therefore, the capacitance value between each embedded insulating film 19 and the epitaxial layer 3 is made further lowered in comparison to the capacitance value (capacitance value C) between each field plate electrode 7 and the epitaxial layer 3. The increase of the capacitance value per unit area can thereby be suppressed effectively in comparison to the structure of the semiconductor device 28 of the reference example.

Also, according to the semiconductor device 1 of the present preferred embodiment, the width $W_2$ of each second trench 18 is smaller than the width $W_1$ of each first trench 6. Enlargement of the semiconductor layer 4 in accompaniment with providing more second trenches 18 can thus be suppressed or prevented. The above-described effect can thus be achieved while suppressing or preventing the enlargement of the semiconductor device 1.

As described above, according to the semiconductor device 1 of the present preferred embodiment, the increase of capacitance value can be suppressed while achieving the reduction of the ON resistance. The breakdown withstand voltage at the first trench 6 side can also be maintained by the embedded insulating film 19 formed in each second trench 18.

Figure 4:
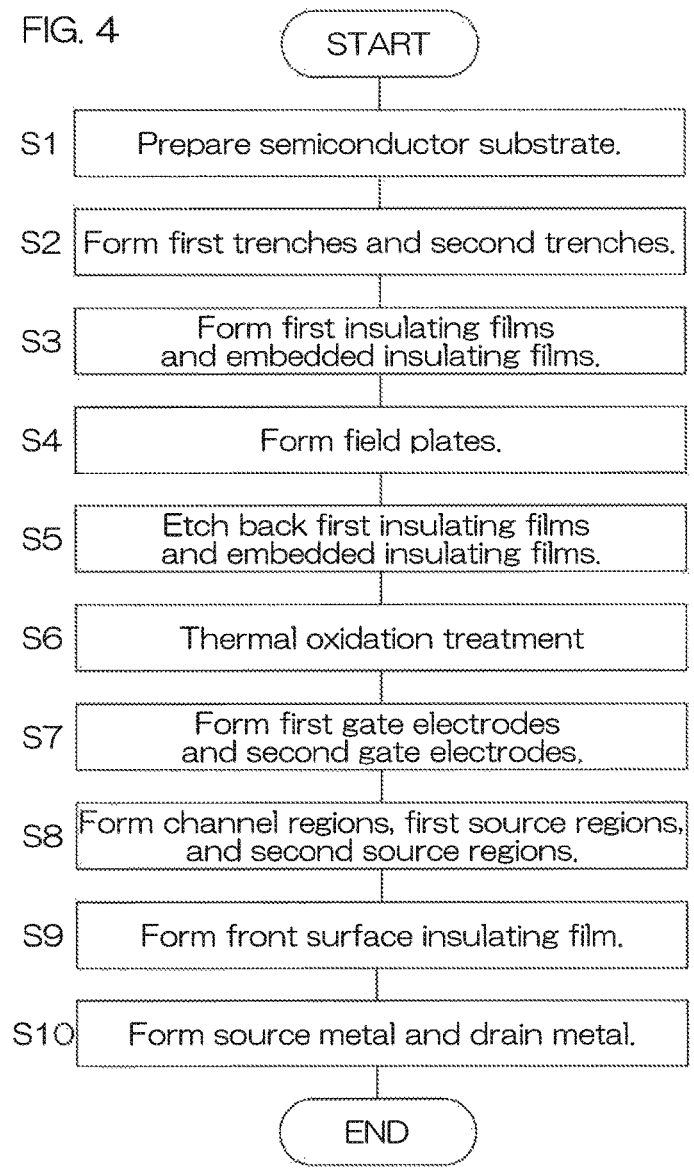
FIG. 4 is a flowchart for describing an example of a method for manufacturing the semiconductor device of FIG. 1.

FIG. 4 is a flowchart for describing an example of a method for manufacturing the semiconductor device 1 of FIG. 1. FIG. 5A to FIG. 5J are sectional views of the method for manufacturing the semiconductor device 1 of FIG. 1. In FIG. 5A to FIG. 5J, only a portion in which a single first trench 6 and a single second trench 18 are formed is shown in enlarged manner for convenience of description.

With reference to FIG. 5A, first, the semiconductor substrate 2 is prepared (step S1 of FIG. 4). The semiconductor substrate 2 is constituted, for example, of silicon.

Next, silicon is grown epitaxially from a front surface of the semiconductor substrate 2 to form the epitaxial layer 3 on the semiconductor substrate 2. The semiconductor layer 4, including the semiconductor substrate 2 and the epitaxial layer 3, is thereby formed.

Next, a hard mask 31, having a predetermined pattern, is formed on the front surface of the semiconductor layer 4 (step S2 of FIG. 4). The hard mask 31 has first openings 29 and second openings 30. The first openings 29 expose regions in which the first trenches 6 are to be formed in the semiconductor layer 4. The second openings 30 expose regions in which the second trenches 18 are to be formed in the semiconductor layer 4.

Next, a surface layer portion of the semiconductor layer 4 is removed partially by etching via the hard mask 31. The first trenches 6 and the second trenches 18 are thereby formed in the front surface of the semiconductor layer 4. After the first trenches 6 and the second trenches 18 have been formed, the hard mask 31 is removed.

Figure 5B:
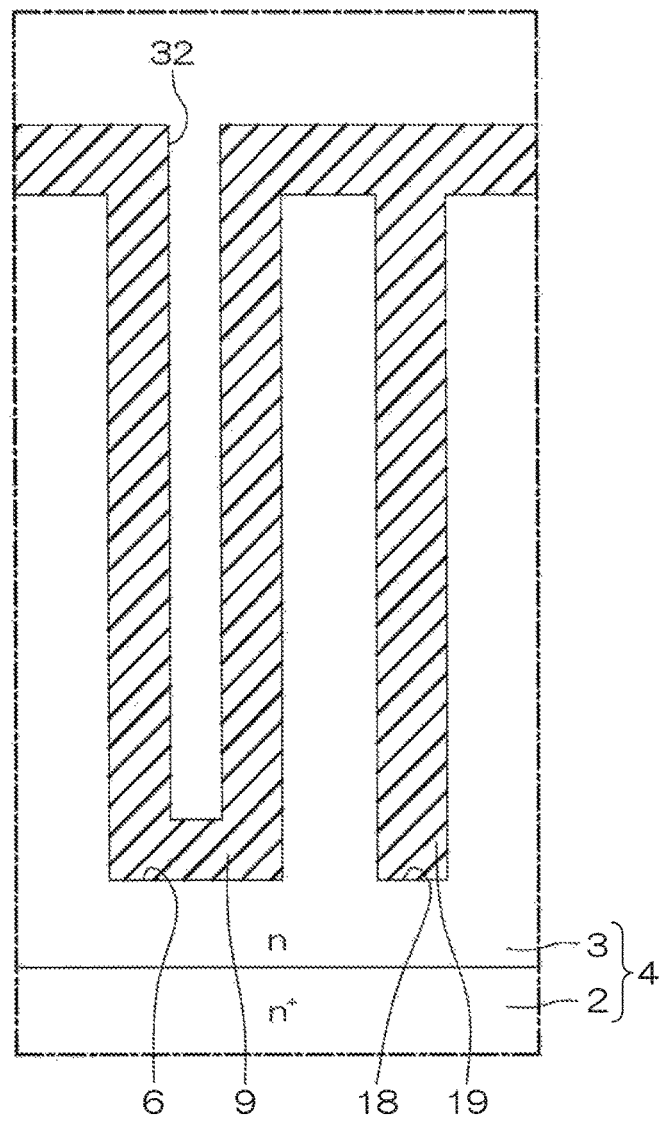

Next, with reference to FIG. 5B, an insulating material is selectively deposited on the front surface of the semiconductor layer 4 (step S3 of FIG. 4). For example, a CVD (Chemical Vapor Deposition) method is used for the deposition of the insulating material. The insulating material is, for example, silicon oxide.

The first insulating films 9 are thereby formed in the first trenches 6. Each first insulating film 9 is formed so that one surface and the other surface are formed along inner wall surface of the corresponding first trench 6 so as to define a recessed space 32 inside the first trench 6. The embedded insulating films 19 are also formed thereby in the second trenches 18. Each embedded insulating film 19 is formed so as to fill an entirety of the corresponding second trench 18.

Figure 5C:
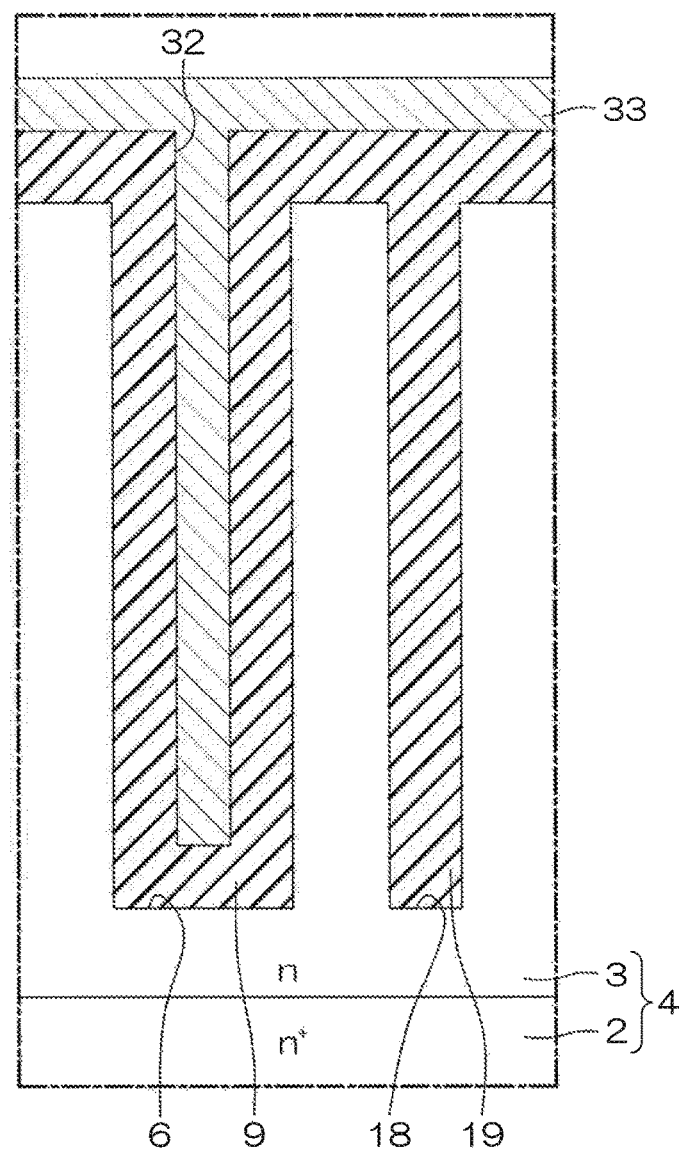

Next, with reference to FIG. 5C, a conductive material is deposited to form a first conductor film 33 above the front surface of the semiconductor layer 4 (step S4 of FIG. 4). The first conductor film 33 is embedded in the recessed spaces 32 defined by the first insulating films 9. For example, the CVD method is used for the deposition of the conductive material.

In the present preferred embodiment, the conductive material of the first conductor film 33 is a polysilicon. When a polysilicon is used as the conductive material, an impurity (for example, phosphorus) is added to the polysilicon. The polysilicon is thereby imparted with conductivity.

Figure 5D:
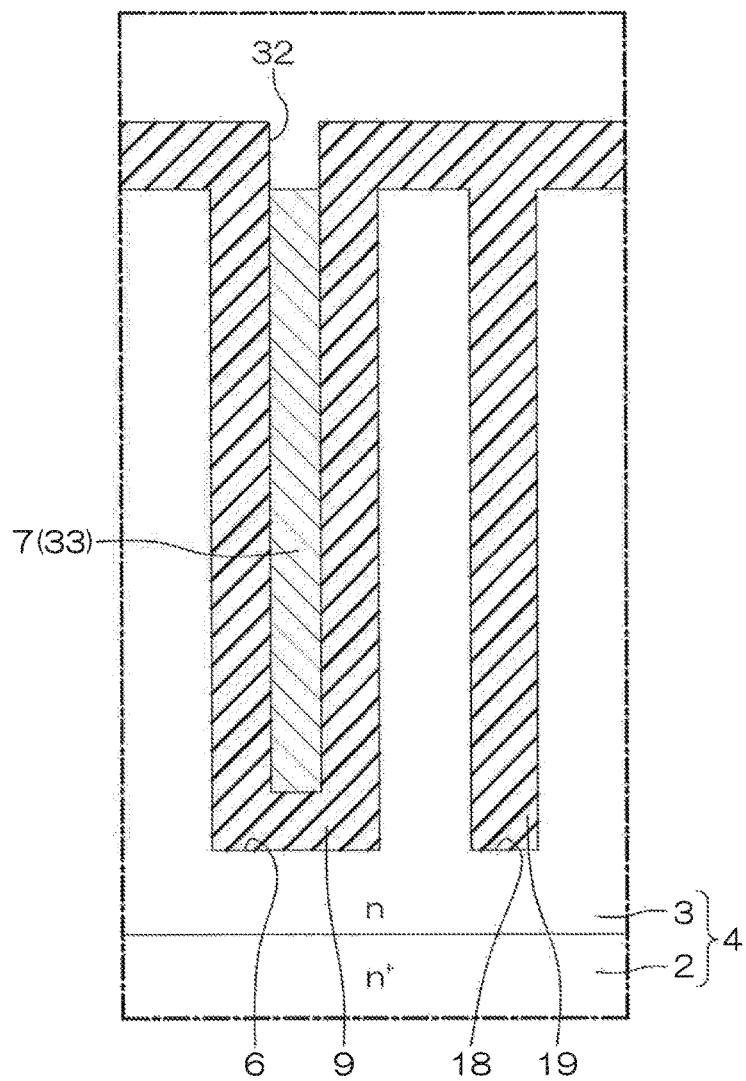

Next, with reference to FIG. 5D, unnecessary portions of the first conductor film 33 are removed, for example, by etching back. The field plate electrodes 7 are thereby formed by the first conductor film 33 embedded in the first trenches 6.

Figure 5E:
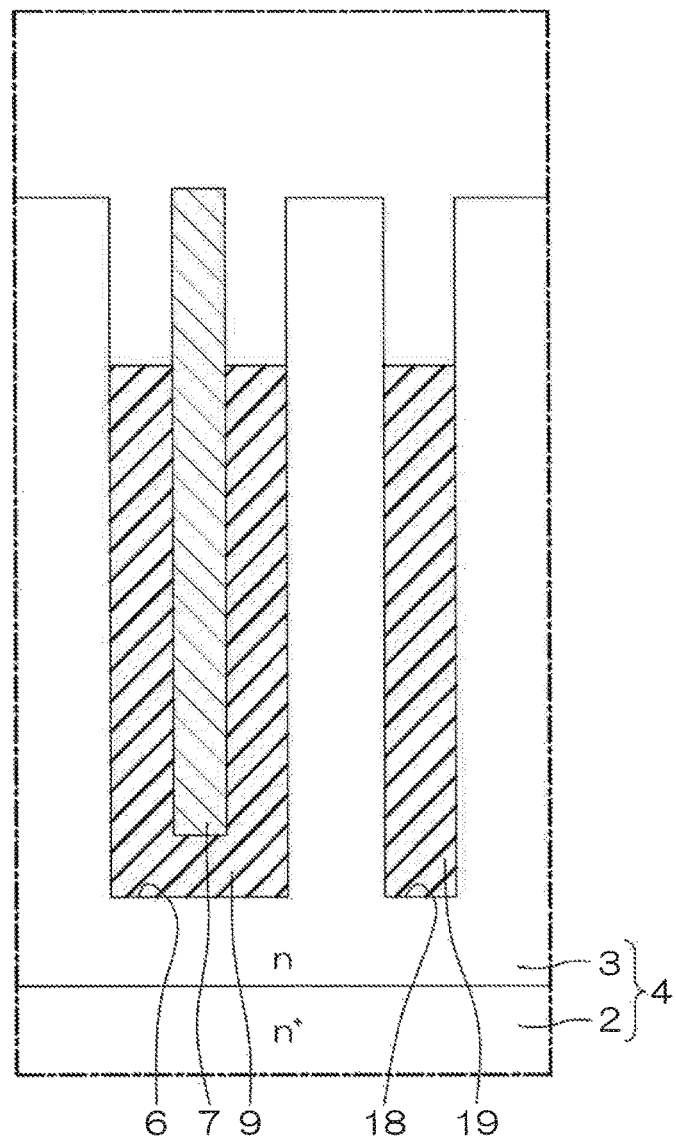

Next, with reference to FIG. 5E, unnecessary portions of the first insulating films 9 and the embedded insulating films 19 are removed, for example, by etching back (step S5 of FIG. 4).

Each first insulating film 9 is removed to the intermediate portion in the depth direction of the corresponding first trench 6. That is, the first insulating film 9 is removed to a height at which its upper end portion is positioned between the front surface of the semiconductor layer 4 and the bottom portion of the first trench 6. The upper end portion of the first insulating film 9 is positioned lower than an upper end portion of the corresponding field plate electrode 7 in regard to the thickness direction of the semiconductor layer 4.

Similarly, each embedded insulating film 19 is removed to the intermediate portion in the depth direction of the corresponding second trench 18. That is, the embedded insulating film 19 is removed to a height at which its upper end portion is positioned between the front surface of the semiconductor layer 4 and the bottom portion of the second trench 18. The upper end portion of the embedded insulating film 19 is positioned lower than the upper end portions of the field plate electrodes 7 in regard to the thickness direction of the semiconductor layer 4.

Figure 5F:
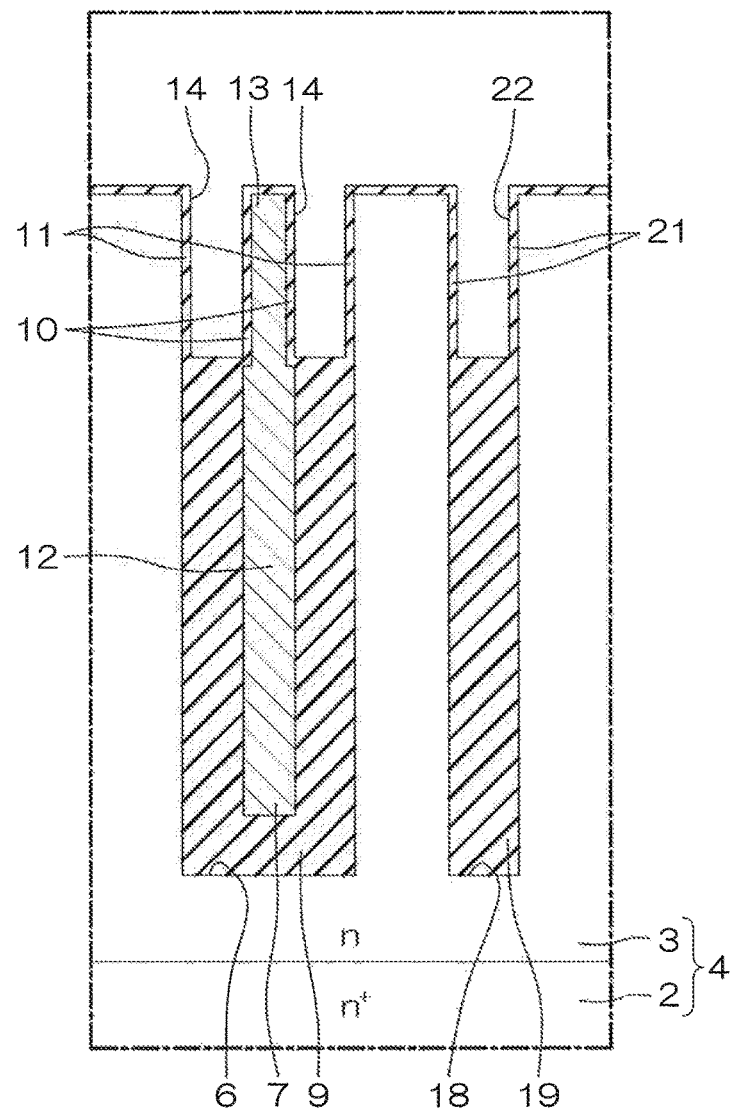

Next, with reference to FIG. 5F, a thermal oxidation treatment is applied to the semiconductor layer 4 (step S6 of FIG. 4). The first gate insulating films 11, the second insulating films 10, and the second gate insulating films 21 are thereby formed simultaneously.

Each first gate insulating film 11 is formed so that one surface and the other surface are formed along an inner wall surface of the first trench 6 that is exposed from the first insulating film 9.

Each second insulating film 10 is formed so that one surface and the other surface are formed along outer surface of the field plate electrode 7 exposed from the first insulating film 9.

Each second gate insulating film 21 is formed so that one surface and the other surface are formed along an inner wall surface of the second trench 18 exposed from the embedded insulating film 19.

In this step, the second insulating films 10, the first gate insulating films 11, and the second gate insulating films 21 are formed to be of substantially equal thickness. At the projecting portion 13 of each field plate electrode 7, oxidation proceeds toward an interior from the outer surface. The projecting portion 13 of the field plate electrode 7 is thus formed to be narrower than the main body portion 12 of the field plate electrode 7.

The second insulating films 10, the first gate insulating films 11, and the second gate insulating films 21 may be formed by the CVD method instead of by thermal oxidation treatment. In this case, an insulating material is deposited on the front surface of the semiconductor layer 4 by the CVD method. In this case, the width of the projecting portion 13 of each field plate electrode 7 is made substantially equal to the width of the main body portion 12 of the field plate electrode 7.

Next, with reference to FIG. 5G, a conductive material is deposited to form a second conductor film 34 above the front surface of the semiconductor layer 4 (step S7 of FIG. 4). For example, the CVD method is used for the deposition of the conductive material. The second conductor film 34 is embedded in the recessed spaces 14 defined at the opening sides of the first trenches 6 and the recessed spaces 22 defined at the opening sides of the second trenches 18.

In the present preferred embodiment, the conductive material of the second conductor film 34 is a polysilicon. When a polysilicon is used as the conductive material, an impurity (for example, phosphorus) is added to the polysilicon. The polysilicon is thereby imparted with conductivity.

Next, with reference to FIG. 5H, unnecessary portions of the second conductor film 34 are removed, for example, by etching back.

The second conductor film 34 is thereby embedded in the spaces 14 at the opening sides of the first trenches 6. The first gate electrodes 8 are formed by the second conductor film 34 embedded in the spaces 14. Also, the second conductor film 34 is thereby embedded in the spaces 22 at the opening sides of the second trenches 18. The second gate electrodes 20 are formed by the second conductor film 34 embedded in the spaces 22.

Next, with reference to FIG. 5I, the channel regions 5, the first source regions 17, and the second source regions 23 are formed in the surface layer portion of the semiconductor layer 4 (step S8 of FIG. 4).

The channel regions 5 are formed by selectively introducing a p type impurity in each region between a first trench 6 and a second trench 18 in the surface layer portion of the semiconductor layer 4. The first source regions 17 and the second source regions 23 are formed by selectively introducing an n type impurity in surface layer portions of the channel regions 5.

The step of forming the first source regions 17 and the second source regions 23 may be performed subsequent a step of forming the channel regions 5 or may be performed prior to the step of forming the channel regions 5.

The processes of forming the channel regions 5, the first source regions 17, and the second source regions 23 (step S8 of FIG. 4) may be performed prior to the step of forming the first trenches 6 and the second trenches 18 (step S2 of FIG. 4).

The processes of forming the channel regions 5, the first source regions 17, and the second source regions 23 (step S8 of FIG. 4) may be performed prior to the step of forming the first gate electrodes 8 and the second gate electrodes 20 (step S7 of FIG. 4).

Next, with reference to FIG. 5J, the front surface insulating film 24 is formed above the front surface of the semiconductor layer 4 (step S9 of FIG. 4). The front surface insulating film 24 is formed by depositing an insulating material above the front surface of the semiconductor layer 4. For example, the CVD method is used for the deposition of the insulating material.

Next, unnecessary portions of the front surface insulating film 24 are selectively removed, for example, by etching via a mask (not shown). The contact openings 25 that selectively expose the channel regions 5, the first source regions 17, and the second source regions 23 are thereby formed in the front surface insulating film 24.

Thereafter, the source electrode 26 is formed on the front surface insulating film 24, for example, by a sputtering method and/or a plating method (step S10 of FIG. 4). Also, the drain electrode 27 is formed at the rear surface side of the semiconductor layer 4, for example, by the sputtering method and/or the plating method. The semiconductor device 1 is manufactured through processes such as the above.

According to the method for manufacturing the semiconductor device 1 of the present preferred embodiment, the plurality of first trenches 6 and the second trenches 18 are formed in the front surface of the semiconductor layer 4. The second trenches 18 are formed in the regions between the plurality of first trenches 6. Each channel region 5 is formed in the surface layer portion of the semiconductor layer 4, between a first trench 6 and a second trench 18 that are mutually adjacent.

The field plate electrodes 7 and the first gate electrodes 8 are embedded in the respective first trenches 6. In the respective first trenches 6, the first gate electrodes 8 face the channel regions 5 across the first gate insulating films 11. On the other hand, the second gate electrodes 20 and the embedded insulating films 19 are embedded in the second trenches 18. In the second trenches 18, the second gate electrodes 20 face the channel regions 5 across the second gate insulating films 21.

A current path (first channel CH1) is thus formed in each of the channel region 5 formed at one lateral surface side of each first trench 6 and the channel region 5 formed at the other lateral surface side of each first trench 6. Also, a current path (second channel CH2) is formed in each of the channel region 5 formed at one lateral surface side of the second trench 18 and the channel region 5 formed at the other lateral surface side of the second trench 18.

The proportion of the area of the first channels CH1 and the second channels CH2 per unit area can thereby be increased. The semiconductor device 1, having a structure where the reduction of the ON resistance can be achieved, can thus be manufactured and provided.

Also, the embedded insulating films 19 are embedded in the second trenches 18 formed in the regions between the plurality of first trenches 6. The capacitance value between each embedded insulating film 19 and the semiconductor layer 4 is smaller than the capacitance value between each field plate electrode 7 and the semiconductor layer 4.

The increase of capacitance value per unit area can thus be suppressed in comparison to a case where the same first trenches 6 are provided additionally in regions between mutually adjacent ones of the plurality of first trenches 6. The semiconductor device 1, having a structure where the increase of capacitance value can be suppressed, can thus be manufactured and provided.

Also, according to the method for manufacturing the semiconductor device 1 of the present preferred embodiment, the first trenches 6 and the second trenches 18 can be formed by common processes (see step S2 of FIG. 4). Also, the first insulating films 9 and the embedded insulating films 19 can be formed by common processes (see step S3 and step S5 of FIG. 4).

Also, the first gate insulating films 11, the second insulating films 10, and the second gate insulating films 21 can be formed by common processes (see step S6 of FIG. 4). Also, the first gate electrodes 8 and the second gate electrodes 20 can be formed by common processes (see step S7 of FIG. 4).

According to the method for manufacturing the semiconductor device 1 of the present preferred embodiment, the structures at the second trench 18 side can thus be formed through common processes with the structures at the first trench 6 side. The increase of workload, etc., due to additionally providing the second trenches 18 can thereby be suppressed or prevented.

Although a preferred embodiment of the present invention has been described above, the present invention may also be implemented in yet other modes.

Each first trench 6 may be formed to a quadrilateral shape in sectional view that is substantially perpendicular to the front surface of the semiconductor layer 4. The first trench 6 may be formed to a tapered shape in sectional view, where an opening width narrows gradually along the depth direction thereof. The bottom portion of the first trench 6 may be formed to be parallel to the front surface of the semiconductor layer 4. The bottom portion of the first trench 6 may be formed to a curved shape that is rounded outward from the lateral surface thereof.

Each second trench 18 may be formed to a quadrilateral shape in sectional view that is substantially perpendicular to the front surface of the semiconductor layer 4. The second trench 18 may be formed to a tapered shape in sectional view, where an opening width narrows gradually along the depth direction thereof. The bottom portion of the second trench 18 may be formed to be parallel to the front surface of the semiconductor layer 4. The bottom portion of the second trench 18 may be formed to a curved shape that is rounded outward from the lateral surface thereof.

In the preferred embodiment described above, a structure in which the conductivity types of the respective semiconductor portions are inverted may be adopted. That is, a p type portion may be of an n type and an n type portion may be of a p type.

The semiconductor device 1 of the configuration shown in FIG. 6 may be adopted. FIG. 6 is a sectional view of a first modification example of the semiconductor device 1 of FIG. 1. FIG. 6 is also a sectional view of a portion corresponding to that of FIG. 2 described above. In FIG. 6, arrangements that are the same as the arrangements described above with the preferred embodiment are provided with the same reference symbols and description thereof shall be omitted.

Referring to FIG. 6, the field plate electrodes 7 do not have the projecting portions 13 and include only the main body portions 12. In each field plate electrode 7, an upper end portion of the main body portion 12 is covered by the second insulating film 10. At the opening side of the first trench 6, a single recessed space 35 is defined by the first gate insulating film 11, the first insulating film 9, and the second insulating film 10.

The first gate electrode 8 is embedded in the single recessed space 35 defined at the opening side of the first trench 6. Therefore, unlike in the preferred embodiment described above, the first gate electrode 8 is not divided into the first portion 15 and the second portion 16 by the projecting portion 13 of the field plate electrode 7 in the present modification example.

According to such a structure, the same effects as the effects described above in the preferred embodiment can be achieved.

The semiconductor device 1 according to the present modification example may be formed by adjusting an etching amount of the first conductor film 33 in the step of etching back the first conductor film 33 (see step S4 of FIG. 4). That is, the first conductor film 33 is removed so that an upper end portion of the first conductor film 33 is at approximately the same height position as the upper end portion of the first insulating film 9.

Figure 7:
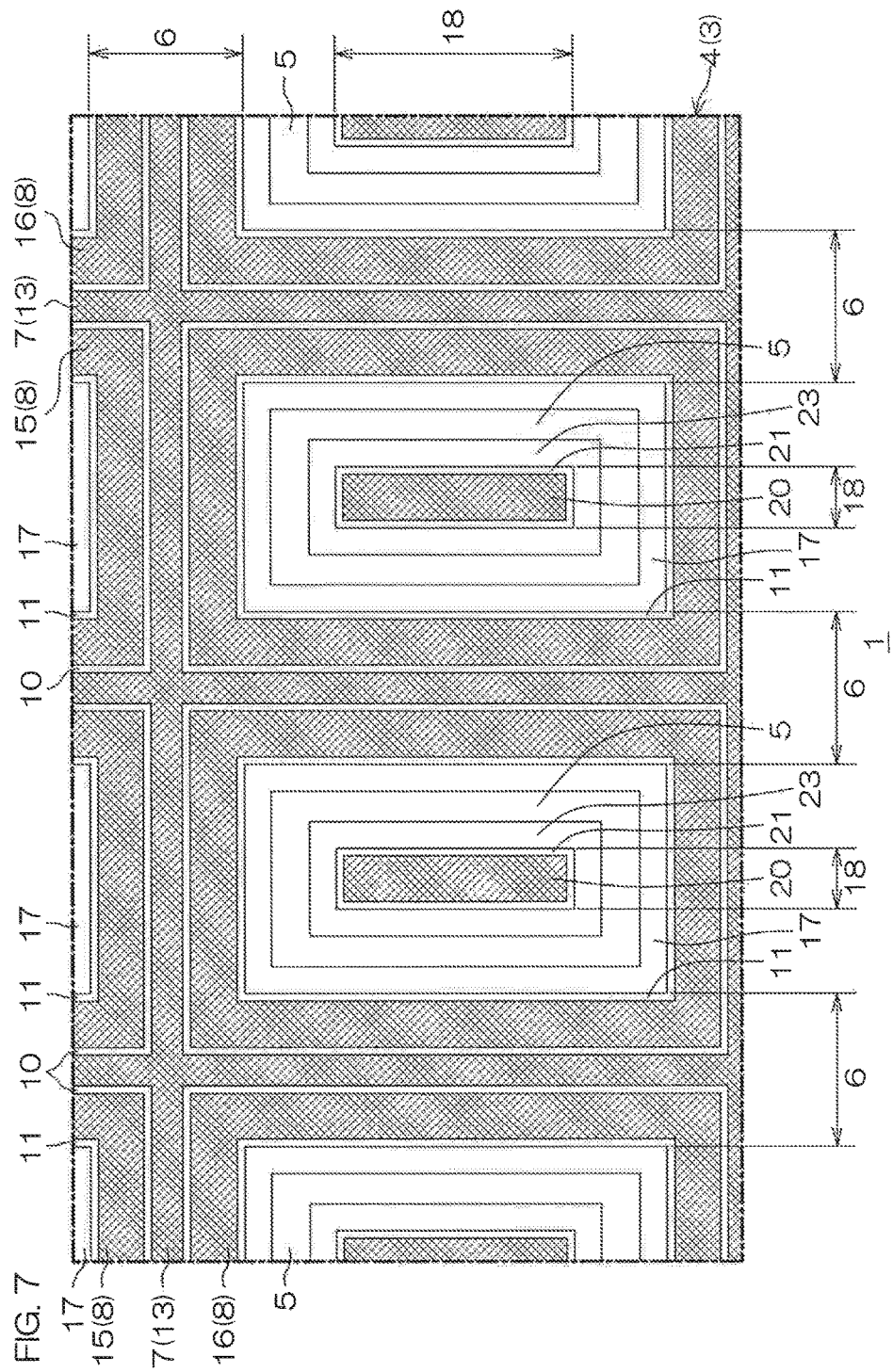
FIG. 7 is a plan view of a second modification example of the semiconductor device of FIG. 1.

Also, the semiconductor device 1 having a configuration such as shown in FIG. 7 may be adopted. FIG. 7 is a plan view of a second modification example of the semiconductor device 1 of FIG. 1. In FIG. 7, arrangements that are the same as the arrangements described above with the preferred embodiment are provided with the same reference symbols and description thereof shall be omitted.

Referring to FIG. 7, in the front surface of the semiconductor layer 4, a plurality of first trenches 6 are formed along the first direction and a plurality of first trenches 6 are formed along the second direction. Therefore, in the present modification example, the first trenches 6 are formed in a lattice in plan view in the front surface of the semiconductor layer 4. Each second trench 18 is formed in the front surface of the semiconductor layer 4 in a region of quadrilateral shape in plan view that is surrounded by the first trenches 6.

Each first source region 17 is formed along inner peripheral edges of the first trenches 6. Each second source region 23 is formed so as to surround a peripheral edge of a second trench 18.

According to such a structure, the same effects as the effects described above in the preferred embodiment can be achieved.

The present application corresponds to Japanese Patent Application No. 2016-76793 filed in the Japan Patent Office on Apr. 6, 2016, and the entire disclosure of this application is incorporated herein by reference.

While preferred embodiments of the present invention have been described in detail above, these are merely specific examples used to clarify the technical contents of the present invention, and the present invention should not be interpreted as being limited only to these specific examples, and the scope of the present invention shall be limited only by the appended claims.

What is claimed is:

1. A method for manufacturing a semiconductor device, comprising the steps of:
   forming a plurality of first trenches in a front surface of a semiconductor layer;
   forming a second trench in the front surface of the semiconductor layer in a region between mutually adjacent ones of the plurality of first trenches;
   introducing an impurity into regions between the first and second trenches in a surface layer portion of the semiconductor layer to form channel regions;
   forming first insulating films along inner wall surfaces of the respective first trenches so as to define recessed spaces inside the respective first trenches;
   embedding an insulator in the second trench to form an embedded insulating film;
   embedding conductors in the recessed spaces defined in the respective first trenches to form field plate electrodes;
   removing the first insulating films to intermediate portions in a depth direction of the respective first trenches;
   removing the embedded insulating film to an intermediate portion in a depth direction of the second trench;
   forming first gate insulating films along portions of the inner wall surfaces of the respective first trenches that are exposed from the first insulating films;
   forming second insulating films along outer surfaces of the field plate electrodes that are exposed from the first insulating films inside the respective first trenches;
   forming a second gate insulating film along a portion of an inner wall surface of the second trench that is exposed from the embedded insulating film;
   embedding conductors in recessed spaces, defined by the first insulating films, the first gate insulating films, and the second insulating films, inside the respective first trenches to form first gate electrodes; and
   embedding a conductor in a recessed space, defined by the embedded insulating film and the second gate insulating film, in the second trench to form a second gate electrode.

2. The method for manufacturing the semiconductor device according to claim 1, wherein the step of forming the plurality of first trenches and the step of forming the second trench are performed simultaneously.

3. The method for manufacturing the semiconductor device according to claim 1, wherein the step of forming the first insulating films and the step of forming the embedded insulating film are performed simultaneously.

4. The method for manufacturing the semiconductor device according to claim 1, wherein the step of removing the first insulating films and the step of removing the embedded insulating film are performed simultaneously.

5. The method for manufacturing the semiconductor device according to claim 1, wherein the step of forming the first gate insulating films, the step of forming the second insulating films, and the step of forming the second gate insulating film are performed simultaneously.

6. The method for manufacturing the semiconductor device according to claim 1, wherein the step of forming the first gate electrodes and the step of forming the second gate electrode are performed simultaneously.

* * * * *